(12) United States Patent
Naono

(10) Patent No.: US 10,136,536 B2
(45) Date of Patent: Nov. 20, 2018

(54) RESILIENT SHIELDING MEMBER FOR DEVICE

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventor: Hideo Naono, Mie (JP)

(73) Assignees: AutoNetworks Technologies, Ltd. (JP); Sumitomo Wiring Systems, Ltd. (JP); Sumitomo Electric Industries, Ltd. (JP)

( * ) Notice: Subject to any disclaimer, the term of this patent is extended or adjusted under 35 U.S.C. 154(b) by 0 days.

(21) Appl. No.: 15/575,829

(22) PCT Filed: Jun. 1, 2016

(86) PCT No.: PCT/JP2016/066273
§ 371 (c)(1),
(2) Date: Nov. 21, 2017

(87) PCT Pub. No.: WO2016/199650
PCT Pub. Date: Dec. 15, 2016

(65) Prior Publication Data
US 2018/0124940 A1    May 3, 2018

(30) Foreign Application Priority Data
Jun. 8, 2015 (JP) ................. 2015-115598

(51) Int. Cl.
*H05K 5/00* (2006.01)
*H05K 5/06* (2006.01)
(Continued)

(52) U.S. Cl.
CPC .......... *H05K 5/069* (2013.01); *H01R 13/533* (2013.01); *H05K 9/0049* (2013.01)

(58) Field of Classification Search
CPC ........................ H05K 5/069; H05K 9/0049
See application file for complete search history.

(56) References Cited

U.S. PATENT DOCUMENTS 9,022,794 B2 * 5/2015 Wang ................. H01R 13/5202
439/271
9,112,397 B2 * 8/2015 Kobayashi ............... H01R 9/24
(Continued)

FOREIGN PATENT DOCUMENTS

JP    2002-280131    9/2002
JP    2003-243101    8/2003
(Continued)

OTHER PUBLICATIONS

International Search Report dated Aug. 16, 2016.

*Primary Examiner* — Adrian S Wilson
(74) *Attorney, Agent, or Firm* — Gerald E. Hespos; Michael J. Porco; Matthew T. Hespos

(57) ABSTRACT

A resilient shielding member for a device (10) is disposed in a facing space (300) between a conductive motor case (10) of a motor (100) and an inverter case (201) of an inverter device (200). The resilient shielding member surrounds first terminal fittings (102) and second terminal fittings (202) connecting the motor (100) and the inverter device (200) over the entire circumference and is formed by integrating a waterproofing component (11) configured to resiliently contact the motor case (101) and the inverter case (201) in a liquid-tight manner over the entire circumference and a shielding component (13) configured to conductively contact the motor case (101) and the inverter case (201).

10 Claims, 13 Drawing Sheets

(51) Int. Cl.
*H05K 9/00* (2006.01)
*H01R 13/533* (2006.01)

(56) References Cited

U.S. PATENT DOCUMENTS

| | | | |
|---|---|---|---|
| 9,318,849 B2* | 4/2016 | Kobayashi | H01R 13/5205 |
| 9,343,941 B2* | 5/2016 | Okamoto | H01R 13/5202 |
| 9,391,485 B2* | 7/2016 | Kobayashi | H01R 9/24 |
| 2009/0291586 A1 | 11/2009 | Takehara | |
| 2014/0209377 A1 | 7/2014 | Wang | |

FOREIGN PATENT DOCUMENTS

| | | |
|---|---|---|
| JP | 2007-280913 | 10/2007 |
| JP | 2014-146435 | 8/2014 |

* cited by examiner

RESILIENT SHIELDING MEMBER FOR DEVICE

BACKGROUND

Field of the Invention

The invention relates to a resilient shielding member for a device.

Description of the Related Art

Japanese Unexamined Patent Publication No. 2007-280913 discloses an inverter device and a motor that are connected by connectors of a direct connection type without using a wiring harness in an electric or hybrid vehicle. The inverter device and the motor are accommodated respectively in individual metal casings and the connector is fixed to each metal casing. The connectors are mated and connected with the inverter device arranged near the motor. In this way, the miniaturization of the entire device including the inverter device and the motor is realized.

In electric and hybrid vehicles, an inverter device and a motor need to be arranged with a clearance defined therebetween to avoid interference due to vibration during travel. However, terminal fittings on the inverter device side and terminal fittings on the motor side are exposed if the inverter device and the motor are separated. Thus, noise superimposed on a current flowing in the terminal fittings leaks to the outside. Further, an inverter device and a motor that are arranged at positions having a possibility of exposure to water require measures to prevent water from contacting the terminal fittings.

The invention was completed based on the above situation and aims to provide a resilient shielding member for a device having both a function of providing noise countermeasures and a function of providing waterproofing measures.

SUMMARY

The invention is directed to a resilient shielding member for device with a waterproofing component configured to resiliently contact a conductive first shield case of a first electrical device and a second shield case of a second electrical device in a liquid-tight manner over the entire circumference, and a shielding component configured to conductively contact the first and second shield cases. The waterproofing component and the shielding component are integrated and disposed in a facing space between the first and second shield cases and surround conductive paths connecting the first and second electrical devices over the entire circumference.

The waterproofing function component surrounds the conductive paths over the entire circumference while being held in close contact with the first and second shield cases in a liquid-tight manner. Thus, adhesion of moisture to the conductive paths is prevented. Further, the shielding component surrounds the conductive paths over the entire circumference while being conductively held in contact with the first and second shield cases. Thus, leakage of noise superimposed on a current flowing in the conductive paths is prevented. Since the resilient shielding member for the device is formed by integrating the waterproofing component and the shielding component, assembling workability is excellent.

The waterproofing component and the shielding component may be formed separately and formed with fitting portions configured to hold the waterproofing component and the shielding component in an assembled state by being fit to each other. According to this configuration, the structure of a mold for molding the waterproofing component can be simplified as compared to the case where the waterproofing component and the shielding component are integrated by insert molding.

The waterproofing component and the shielding component may be integrated by insert molding. According to this configuration, the shapes of the waterproofing component and the shielding component can be simplified as compared to the case where the waterproofing component and the shielding component are formed as separate components and assembled.

The shielding component may include a resilient contact piece capable of coming into contact with the first and second shield cases while being resiliently deformed. According to this configuration, the shielding component can be brought reliably into contact with both shield cases due to a resilient restoring force of the resilient contact piece.

The shielding component may contact the first and second shield cases in a state where the orientation thereof is changed to resiliently deform the waterproofing component. According to this configuration, the shielding component can be brought reliably into contact with the both shield cases due to a resilient restoring force of the waterproofing component.

DETAILED DESCRIPTION

Figure 1:
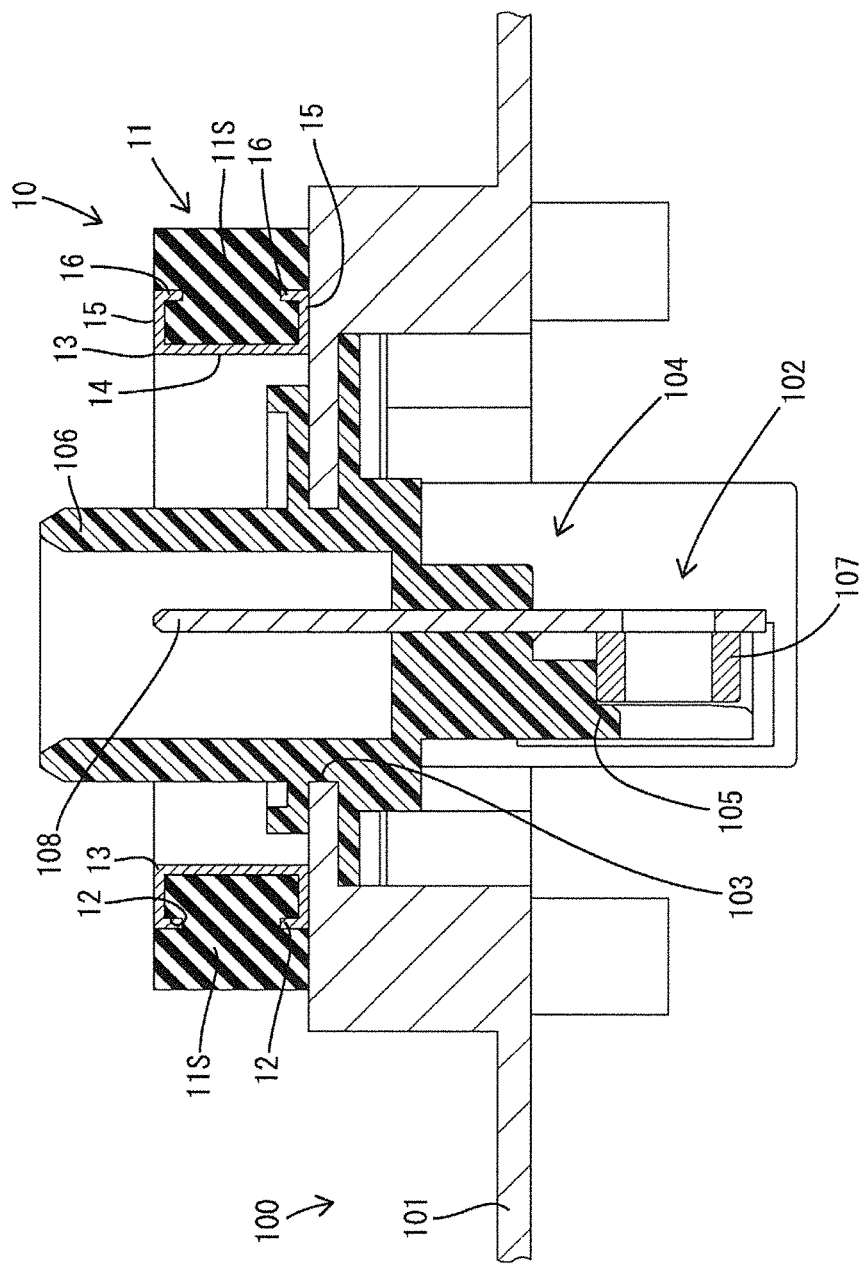
FIG. 1 is a section showing a state where a resilient shielding member for device of a first embodiment is mounted on a motor (first electrical device).
Figure 2:
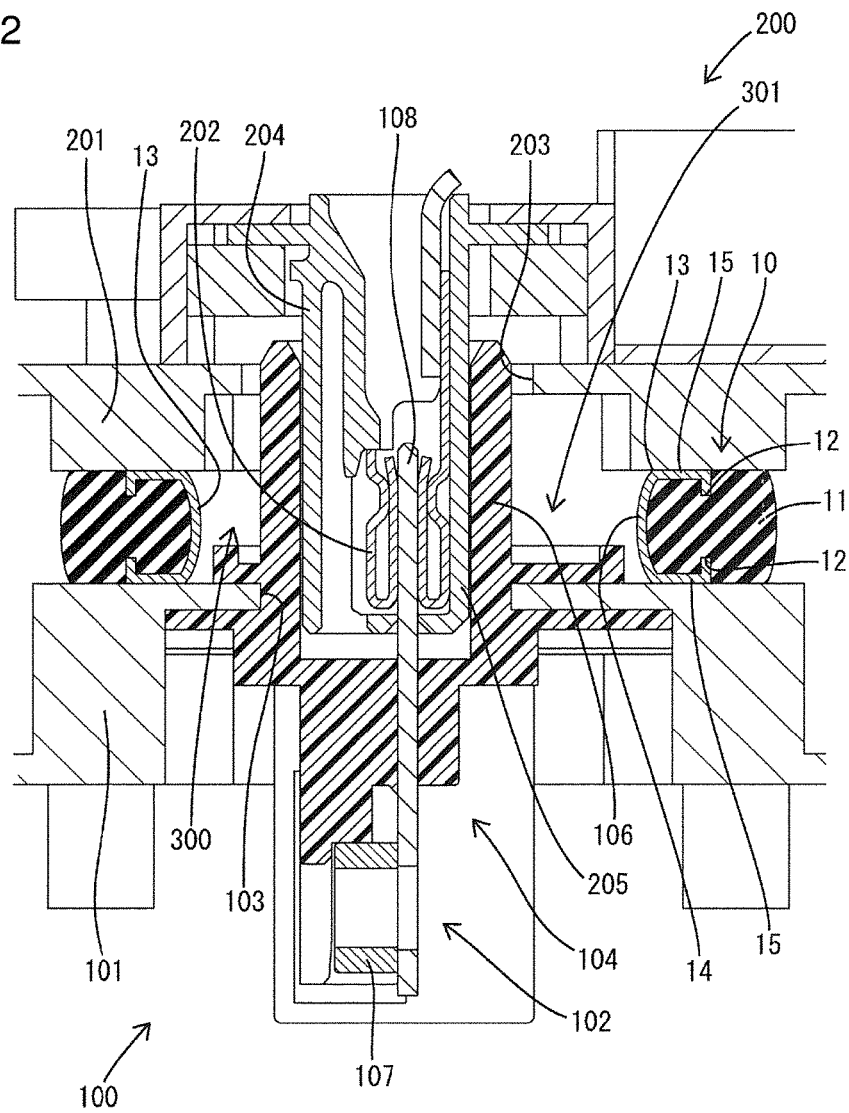
FIG. 2 is a section showing a state where an inverter device is connected to the motor.

A first embodiment of the invention is described with reference to FIGS. 1 to 3. A resilient shielding member for a device 10 of the first embodiment is a composite function member provided in a vehicle configured to travel utilizing electric power such as an electric or hybrid vehicle and interposed between a motor 100 (first electrical device as claimed) and an inverter device 200 (second electrical device as claimed).

The motor 100 includes a motor body (not shown) for generating a rotational drive force by energization, a conductive (metallic) motor case 101 (first shield case as claimed) surrounding the motor body, and a plurality of first terminal fittings 102 (conductive paths as claimed) conductively connected to the motor body. A first opening 103 allowing communication between the inside and outside of the motor case 101 is formed in a horizontal upper surface wall constituting the motor case 101.

A first terminal block 104 made of synthetic resin is fixed in the first opening 103. The first terminal block 104 includes a terminal holding portion 105 and a receptacle 106 projecting upward from the terminal holding portion 105. The receptacle 106 projects upwardly of the motor case 101 through the first opening 103. The plurality of first terminal fittings 102 are mounted in the first terminal block 104 by insert molding. The first terminal fitting 102 is a male terminal including a base end portion 107 to be fixed to the terminal holding portion 105 by an unillustrated bolt, and a tab 108 projecting upward from the base end portion 107 to be accommodated in the receptacle 106. The tab 108 projects further upward (outside of the motor case 101) than the upper surface (upper surface wall) of the motor case 101 similarly to the receptacle 106.

The inverter device 200 includes a power supply circuit (not shown) for converting direct-current power into alternating-current power, a conductive (metallic) inverter case 201 (second shield case as claimed) surrounding the power supply circuit, a plurality of second terminal fittings 202 (conductive paths as claimed) conductively connected to the power supply circuit. A second opening 203 allowing communication between the inside and outside of the inverter case 201 is formed in a horizontal lower surface wall constituting the inverter case 201. A second terminal block 204 made of synthetic resin is fixed in the second opening 203. The second terminal block 204 includes a terminal holding portion 205 projecting downwardly of the inverter case 201. The female second terminal fittings 202 are accommodated in the terminal holding portion 205. The second terminal fittings 202 project further downward (outside of the inverter case 201) than the lower surface (lower surface wall) of the inverter case 201 similarly to the terminal holding portion 205.

The inverter device 100 is disposed above the motor 100, the terminal holding portion 205 is fit into the receptacle 106 and the tabs 108 of the plurality of first terminal fittings 102 enter the terminal holding portion 205 to be individually conductively connected to the plurality of second terminal fittings 202. The motor 100 and the inverter device 200 are conductively connected via these first and second terminal fittings 102, 202. Further, the upper surface wall of the motor case 101 and the lower surface wall of the inverter case 201 are positioned to vertically face each other with a relatively narrow facing space 300 defined therebetween so as not to directly contact.

The facing space 300 is defined between the motor case 101 and the inverter case 201 in this way to avoid interference due to vibration during travel. However, by separating the motor case 101 (motor 100) and the inverter case 201 (inverter device 200), the first terminal fittings 102 of the motor 100 are arranged outside the motor case 101 (in the facing space 300) and the second terminal fittings 202 of the inverter device 200 are arranged outside the inverter case 201 (in the facing space 300). In such an arrangement, noise superimposed on a current flowing in the terminal fittings 102, 202 leaks to outside. Further, if the motor 100 and the inverter device 200 are installed at positions having a possibility of watering, measures to cope with watering on the terminal fittings 102, 202 are necessary.

Accordingly, in the first embodiment, the resilient shielding member for a device 10 is disposed in the facing space 300 between the motor case 101 and the inverter case 201. That configuration is described below. The resilient shielding member for the device 10 is composed of one waterproofing component 11 and two pairs of shielding components 13. The waterproofing component 11 and the shielding components 13 are separately manufactured components.

Figure 3:
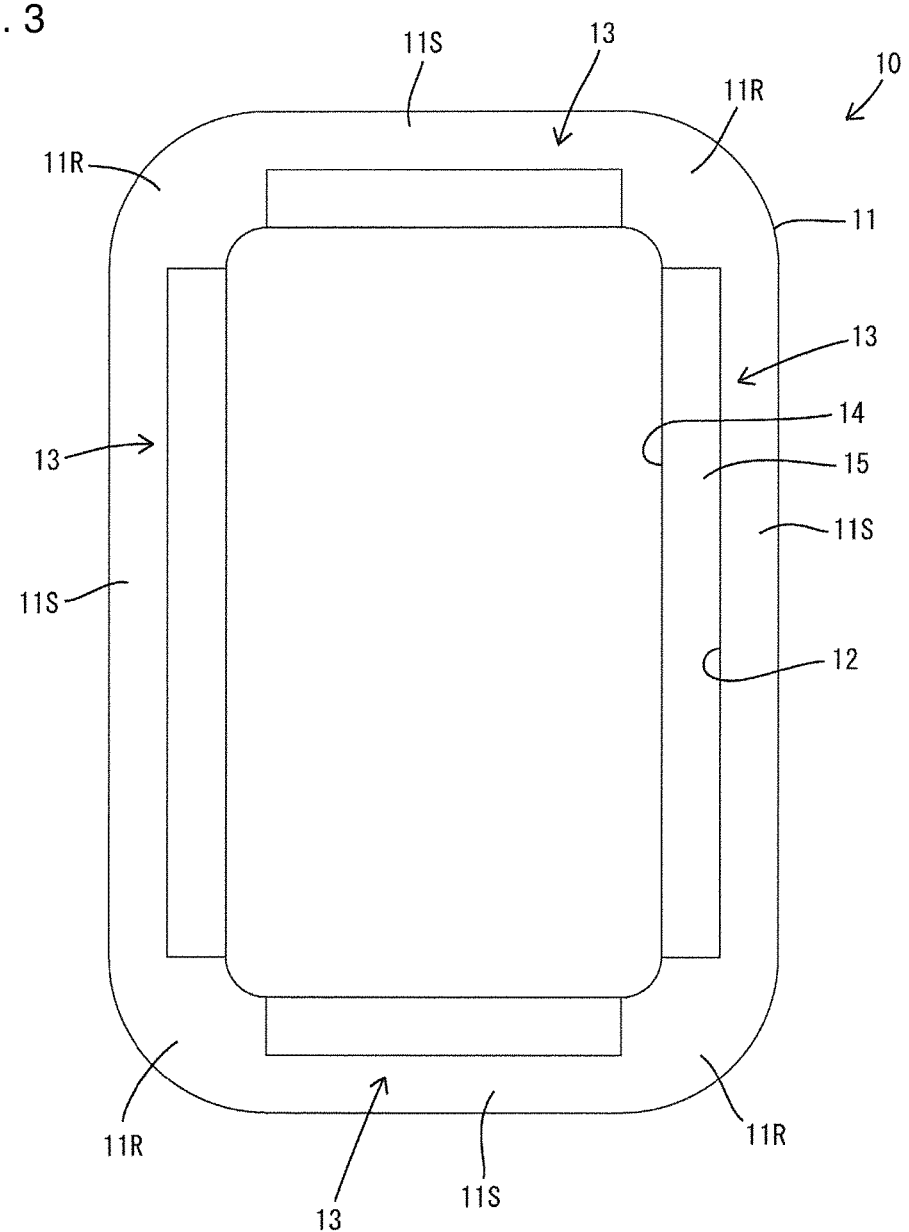
FIG. 3 is a plan view of the resilient shielding member for device of the first embodiment.

The waterproofing component 11 is made of rubber and has a substantially rectangular frame shape (ring shape) in a plan view as shown in FIG. 3. The waterproofing component 11 is composed of two pairs of linear sealing portions 11S extending long straight in a front-rear direction and a lateral direction and four arcuate sealing portions 11R having a substantially quarter-circular shape and smoothly connecting end parts of the linear sealing portions 11S. As shown in FIGS. 1 and 2, each of two pairs of linear sealing portions 11S is formed with a pair of upper and lower fitting grooves 12 (fitting portions as claimed).

Each shielding component 13 is a single component formed by bending a metal plate material. Each shielding component 13 includes a base plate 14 having plate surfaces extending in a vertical direction and upper and lower contact plates 15 extending substantially at a right angle from both upper and lower end edges of the base plate 14. The base plate 14 can be resiliently curved and deformed to bring the both upper and lower contact plates 15 toward each other. The shielding component 13 is formed with a fitting rib 16 (fitting portion as claimed) projecting down substantially at a right angle from an extending end edge of the upper contact plate 15 and a fitting rib 16 (fitting portion as claimed) projecting up substantially at a right angle from an extending end edge of the lower contact plate 15.

The shielding component 13 is assembled with the waterproofing component 11 by holding the base plate 14 in close contact with the inner side surface of the linear sealing portion 11S and fitting the upper and lower fitting ribs 16 into the fitting grooves 12 of the linear sealing portion 11S. The waterproofing component 11 and the shielding components 13 are held in an assembled state and integrated by locking between the fitting grooves 12 and the fitting ribs 16. In a state before the inverter device 200 is connected to the motor 100, the resilient shielding member for device 10 is disposed to collectively surround an opening area of the first opening 103 and an arrangement area of the plurality of first terminal fittings 102 and placed on the upper surface (outer surface) of the upper surface wall of the motor case 101 as shown in FIG. 1.

A vertical dimension of the facing space 300 when the inverter device 200 is connected to the motor 100, i.e. a vertical interval between the upper surface of the motor case 101 and the lower surface of the inverter case 201 is set to be smaller than a vertical dimension of the waterproofing component 11 and the shielding components 13 in a free state where the waterproofing component 11 is not resiliently deformed. Thus, when the inverter device 200 is connected to the motor 100, the waterproofing component 11 made of rubber is vertically compressed and resiliently deformed, and the lower and upper surfaces of the waterproofing component 11 respectively are held resiliently in close contact with the upper surface of the motor case 101 and the lower surface of the inverter case 201 in a liquid-tight manner over the entire circumference.

In this way, a sealing space 301 defined by the resilient shielding member for the device 10 and the cases 101, 201 is configured. This sealing space 301 is a part of the facing space 300 and connected parts of the first and second terminal fittings 102, 202 are accommodated in the sealing space 301. Since this sealing space 301 is sealed by the waterproofing component 11 so that water does not enter, the terminal fittings 102, 202 in the sealing space 301 are kept in a waterproof state.

Further, in the resilient shielding member for device 10, the shielding components 13 are mounted along the inner peripheral surfaces of the linear sealing portions 11S. The shielding components 13 are disposed in most areas of the entire circumference of the resilient shielding member for device 10 except at the arcuate sealing portions 11R. That is, the four shielding function components 13 surround the connected parts of the terminal fittings 102, 202 in the facing space 300 substantially over the entire circumference. The upper and lower contact plates 15 of the shielding component 13 are in contact with the cases 101, 201. The base plate 14 is deformed resiliently and curved by being pressed by the cases 101, 201, the contact plates 15 come into contact with the cases 101, 201 due to a resilient restoring force of this base plate 14. Thus, there is no possibility that noise superimposed on the current flowing in the terminal fittings 101, 202 leaks to the outside of the resilient shielding member for the device 10 (sealing space 301).

The resilient shielding member for the device 10 of the first embodiment has both a function of providing noise countermeasures and a function of providing waterproofing measures and is disposed in the facing space 300 between the conductive motor case 101 of the motor 100 and the inverter case 201 of the inverter device 200 to surround the first and second terminal fittings 102, 202 connecting the motor 100 and the inverter device 200 over the entire circumference. The resilient shielding member for device 10 is formed by integrating the waterproofing component 11 configured to resiliently contact the motor case 101 and the inverter case 201 in a liquid-tight manner over the entire circumference and the shielding components 13 configured to conductively contact the motor case 101 and the inverter case 201.

The waterproofing component 11 surrounds the terminal fittings 102, 202 over the entire circumference while being held in close contact with the motor case 101 and the inverter case 201 in a liquid-tight manner. Thus, adhesion of moisture to the terminal fittings 102, 202 and entrance of water into the motor case 101 and the inverter case 201 are prevented. Further, since the shielding components 13 surround the terminal fittings 102, 202 over the entire circumference while being conductively held in contact with the motor case 101 and the inverter case 201, leakage of noise superimposed on the current flowing in the terminal fittings 102, 202 is prevented. Since the resilient shielding member for the device 10 is formed by integrating the waterproofing component 11 and the shielding components 13, assembling workability is excellent.

Further, the waterproofing component 11 and the shielding components 13 are formed separately from each other and formed with fitting portions (fitting grooves 12 and fitting ribs 16) for holding the waterproofing component 11 and the shielding components 13 in an assembled state by being fit to each other. According to this configuration, the waterproofing component 11 and the shielding components 13 can be held reliably in the assembled state by fitting the fitting grooves 12 and the fitting ribs 16. Further, the structure of a mold for molding the waterproofing component 11 can be simplified as compared to the case where the waterproofing component 11 and the shielding components 13 are integrated by insert molding.

A second embodiment of the invention is described with reference to FIGS. 4 to 6. A resilient shielding member for device 20 of the second embodiment is composed of one waterproofing component 21 and one shielding component 23. Note that the same components as in the above first embodiment are denoted by the same reference signs and the structures, functions and effects thereof are not described.

Figure 4:
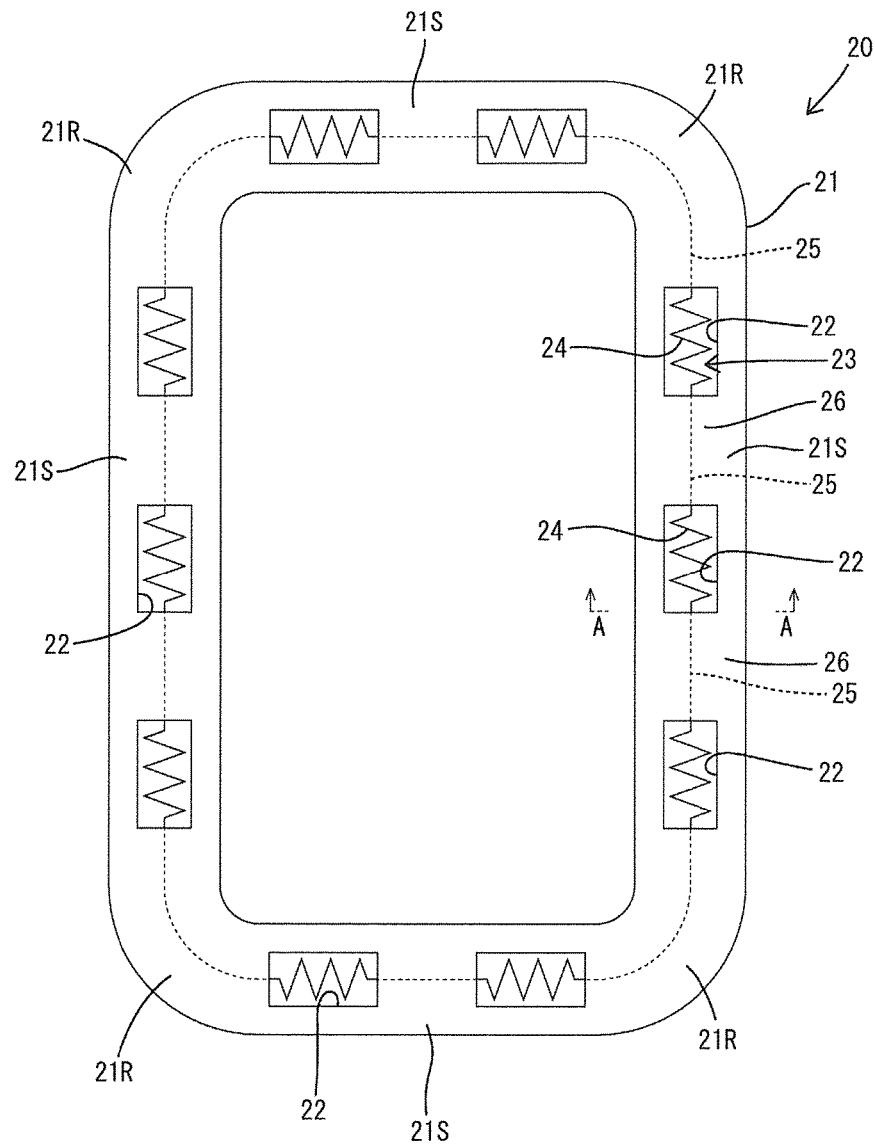
FIG. 4 is a plan view of a resilient shielding member for device of a second embodiment.
Figure 5:
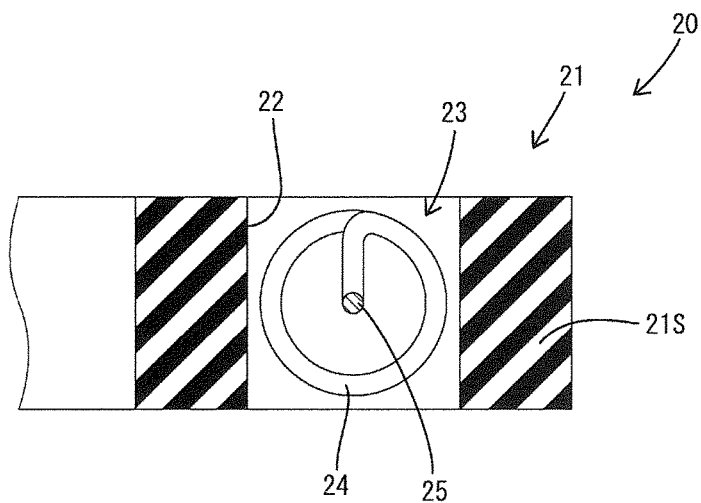
FIG. 5 is a section along A-A of FIG. 4.

The waterproofing component 21 is made of rubber and has a substantially rectangular frame shape (ring shape) in a plan view as shown in FIG. 4. The waterproofing component 21 is composed of two pairs of linear sealing portions 21S extending long straight in a front-rear direction and a lateral direction, and four arcuate sealing portions 21R having a substantially quarter-circular shape and smoothly connecting end parts of the linear sealing portions 21S and those of the linear sealing portions 21S. Each of the linear sealing portions 21S is formed with a plurality of accommodation spaces 22 penetrating from the upper surface (surface facing an inverter device 201) to the lower surface (surface facing a motor case 101).

The shielding component 23 is a single component formed by bending a long and thin metal wire material. The shielding function component 23 is formed such that coiled contact portions 24 and linear coupling portions 25 linking adjacent coiled contact portions 24 are arranged alternately in series. Each coiled contact portion 24 is disposed in the accommodation space 22. The linear coupling portions 25 is embedded in a wall 26 of the waterproofing component 21 defining adjacent accommodation spaces 22. This shielding component 23 is integrated with the waterproofing component 21 by insert molding in a step of molding the waterproofing component 21 with a mold (not shown). Since the components 21, 23 are integrated by insert molding, the shapes of the waterproofing component 21 and the shielding component 23 can be simplified as compared to the case where a waterproofing component and a shielding component formed as separate components are assembled.

Figure 6:
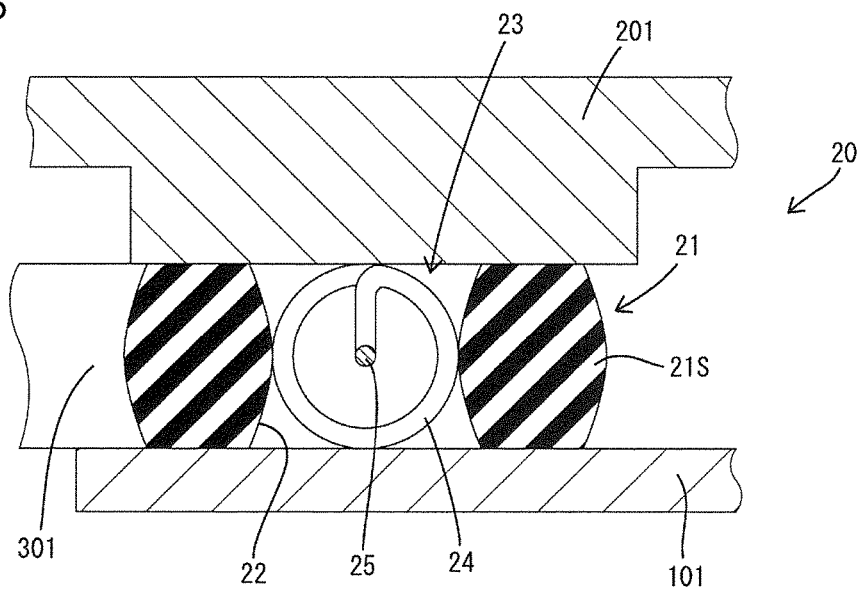
FIG. 6 is a section along A-A showing a state where the resilient shielding member for device is mounted between a first shield case and a second shield case in the second embodiment.

When an inverter device 200 is connected to a motor 100, the resilient shielding member for device 20 is sandwiched between the upper surface of the motor case 101 and the lower surface of the inverter case 201 as shown in FIG. 6. In this way, the waterproofing component 21 made of rubber is compressed vertically and deformed resiliently, and the lower and upper surfaces of the waterproofing component 21 respectively are held resiliently in close contact with the upper surface of the motor case 101 and the lower surface of the inverter case 201 in a liquid-tight manner over the entire circumference. By this waterproofing component 21, a sealing space 301 in which terminal fittings 102, 202 are accommodated can be waterproofed. Further, the coiled contact portions 24 of the shielding function component 23 are deformed resiliently to be squeezed vertically, and both upper and lower end parts of the coiled contact portions 24 resiliently contact the cases 101, 201 due to resilient restoring forces of the coiled contact portions 24. By this shielding component 23, noise superimposed on a current flowing in the terminal fittings 102, 202 is prevented from leaking to the outside of the resilient shielding member for device 20 (sealing space 301).

Figure 7:
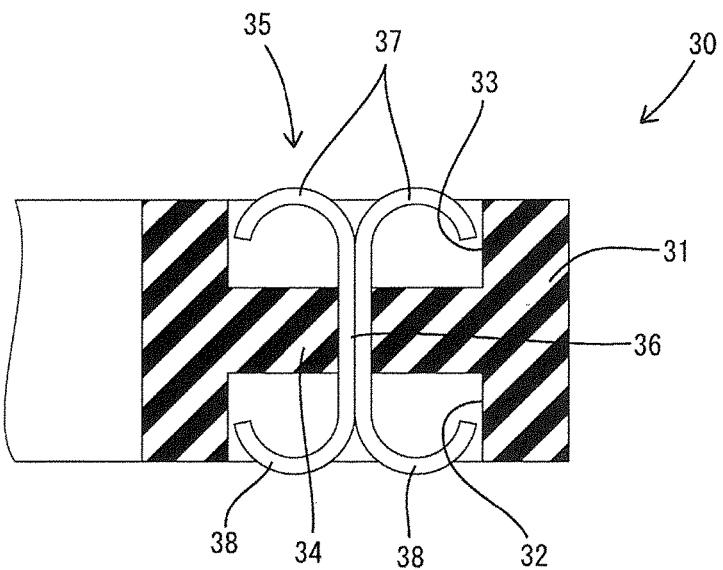
FIG. 7 is a section of a resilient shielding member for device of a third embodiment.

A third embodiment of the invention is described with reference to FIG. 7. A resilient shielding member for device 30 of the third embodiment is composed of one waterproofing component 31 and plural shielding component 35. Note that the same components as in the above first embodiment are denoted by the same reference signs and the structures, functions and effects thereof are not described.

The waterproofing component 31 is made of rubber and has a substantially rectangular frame shape (ring shape) in a plan view as in the first embodiment. The lower surface (surface facing a motor case) of the waterproofing component 31 is recessed to form lower accommodation spaces 32 at appropriate intervals in a circumferential direction. Likewise, areas of the upper surface (surface facing an inverter case) of the waterproofing component 31 corresponding to the lower accommodation spaces 32 are recessed to form upper accommodation spaces 33. The upper accommodation spaces 33 and the lower accommodation spaces are defined by separating walls 34.

The shielding component 35 is constituted of a pair of symmetrically shaped metal plate materials. The shielding component 35 is composed of a base 36 formed by fixing vertically central parts of the metal plate materials to each other by welding or the like, two upper resilient contact pieces 37 (resilient contact piece as claimed) arcuately extending up from the base 36 and two lower resilient contact pieces 38 (resilient contact piece as claimed) arcuately extending down from the base 36. The shielding components 35 are integrated with the waterproofing component 31 by insert molding with the bases 36 embedded in the separating walls 34. The upper resilient contact pieces 33 are accommodated in the upper accommodation spaces 33 and the lower resilient contact pieces 38 are accommodated in the lower accommodation spaces 32.

When an inverter device 200 is connected to a motor 100, the resilient shielding member for device 30 is sandwiched between the upper surface of the motor case 101 and the lower surface of the inverter case 201. In this way, the lower and upper surfaces of the waterproofing component 31 respectively are held resiliently in close contact with the upper surface of the motor case 101 and the lower surface of the inverter case 201 in a liquid-tight manner over the entire circumference, and a sealing space 301 accommodating terminal fittings 102, 202 is kept in a waterproof state. Further, both upper and lower resilient contact pieces 37, 38 of each of the plurality of shielding components 35 are brought into contact with the both cases 101, 201. At this time, since being resiliently deformed, the both resilient contact pieces 37, 38 resiliently and reliably come into contact with the both cases 101, 201 due to resilient restoring forces thereof. By these shielding function components 35, noise superimposed on a current flowing in the terminal fittings 102, 202 is prevented from leaking to the outside of the resilient shielding member for the device 30 (sealing space).

Figure 8:
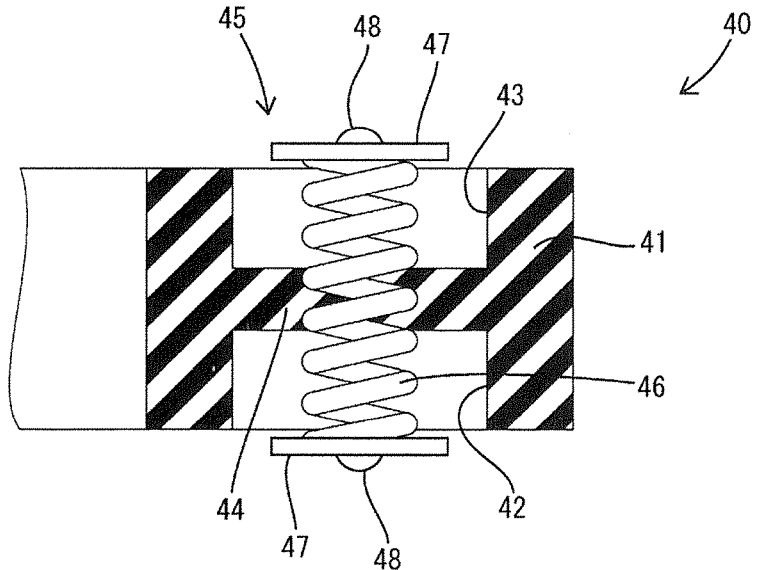
FIG. 8 is a section of a resilient shielding member for device of a fourth embodiment.

A fourth embodiment of the invention is described with reference to FIG. 8. A resilient shielding member for device 40 of the fourth embodiment is composed of one waterproofing component 41 and plural shielding components 45. Note that the same components as in the above first embodiment are denoted by the same reference signs and the structures, functions and effects thereof are not described.

The waterproofing component 41 is made of rubber and has a substantially rectangular frame shape (ring shape) in a plan view as in the first embodiment. The lower surface (surface facing a motor case) of the waterproofing component 41 is recessed to form lower accommodation spaces 42 at appropriate intervals in a circumferential direction. Likewise, areas of the upper surface (surface facing an inverter case) of the waterproofing component 41 corresponding to the lower accommodation spaces 42 are recessed to form upper accommodation spaces 43. The upper accommodation spaces 43 and the lower accommodation spaces are defined by separating walls 44.

The shielding component 45 is composed of a coil 46 whose axial direction extends in a vertical direction and two contact plates 47 conductively fixed to both upper and lower end parts of the coil 46 by welding or the like. An embossed contact point 48 projecting up is formed on the upper contact plate 47 and an embossed contact point 48 projecting down is formed on the lower contact plate 47. The shielding components 45 are integrated with the waterproofing component 41 by insert molding with vertically central parts of the coils 46 embedded in the separating walls 44. Upper end parts of the coils 46 are accommodated in the upper accommodation spaces 43 and lower ends of the coils 46 are accommodated in the lower accommodation spaces 42.

When an inverter device 200 is connected to a motor 100, the resilient shielding member for device 40 is sandwiched between the upper surface of the motor case 101 and the lower surface of the inverter case 201. In this way, the lower and upper surfaces of the waterproofing component 41 respectively are held resiliently in close contact with the upper surface of the motor case 101 and the lower surface of the inverter case 201 in a liquid-tight manner over the entire circumference, and a sealing space 301 accommodating terminal fittings 102, 202 is kept in a waterproof state. Further, the contact points 48 on both upper and lower contact plates 47 of each of the shielding components 45 are brought into contact with both cases 101, 201. At this time, since the coil 46 is deformed resiliently to be squeezed vertically, the contact plates 47 resiliently and reliably come into contact with both cases 101, 201 due to resilient restoring forces thereof. These shielding components 45 prevent noise superimposed on a current flowing in the terminal fittings 102, 202 from leaking to the outside of the resilient shielding member for the device 40 (sealing space).

Figure 9:
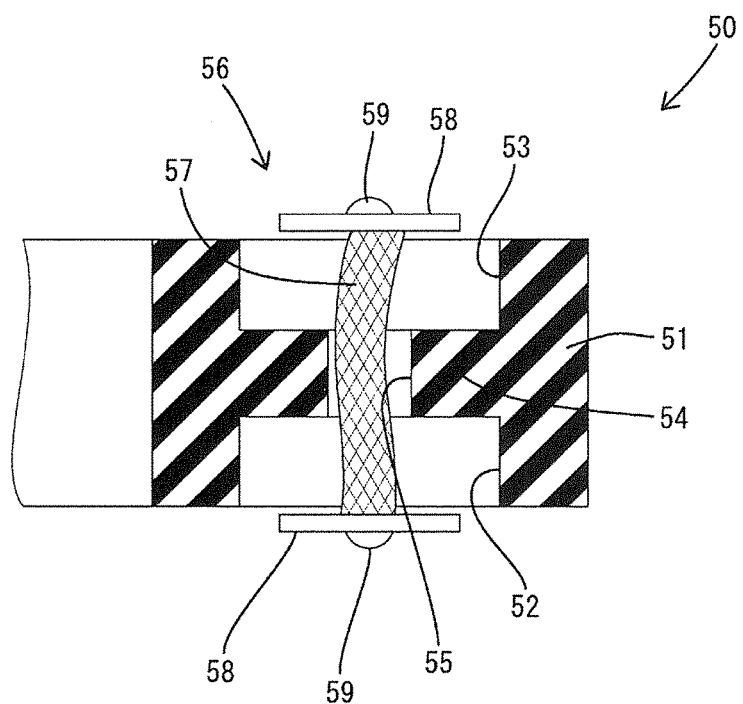
FIG. 9 is a section of a resilient shielding member for device of a fifth embodiment.

A fifth embodiment of the invention is described with reference to FIG. 9. A resilient shielding member for the device 50 of the fifth embodiment is composed of one waterproofing component 51 and plural shielding components 56. Note that the same components as in the above first embodiment are denoted by the same reference signs and the structures, functions and effects thereof are not described.

The waterproofing component 51 is made of rubber and has a substantially rectangular frame shape (ring shape) in a plan view as in the first embodiment. The lower surface (surface facing a motor case) of the waterproofing component 51 is recessed to form lower accommodation spaces 52 at appropriate intervals in a circumferential direction. Likewise, areas of the upper surface (surface facing an inverter case) of the waterproofing component 51 corresponding to the lower accommodation spaces 52 are recessed to form upper accommodation spaces 53. The upper accommodation spaces 53 and the lower accommodation spaces 52 are defined by separating walls 54. Each separating wall 54 is formed with a communication hole 55 allowing the both upper and lower accommodation spaces 52, 53 to communicate.

The shielding component 56 is composed of a resilient supporting body 57 formed of a braided wire and upper and lower contact plates 58 conductively fixed to both upper and lower end parts of the resilient supporting body 57 by welding or the like. The contact plates 58 are in the form of discs having an outer diameter larger than an inner diameter of the communication hole 55. An embossed contact point 59 projecting up is formed on the upper contact plate 58 and an embossed contact point 59 projecting down is formed on the lower contact plate 58. The shielding components 56 are manufactured separately from the waterproofing component 51.

In assembling the shielding component 56 with the waterproofing component 51, the communication hole 55 is widened while the separating wall 54 is deformed resiliently, and one contact plate 58 is passed through the widened communication hole 55. After the passage of the contact plate 58, the widening of the communication hole 55 is cancelled. In this way, the shielding component 56 is integrated with the waterproofing component 51 with the resilient supporting body 57 penetrating through the communication hole 55. An upper end part of the resilient supporting body 57 is accommodated into the upper accommodation space 53, and a lower end part of the resilient supporting body 57 is accommodated into the lower accommodation space 52.

When an inverter device 200 is connected to a motor 100, the resilient shielding member for the device 50 is sandwiched between the upper surface of the motor case 101 and the lower surface of the inverter case 201. In this way, the lower and upper surfaces of the waterproofing component 51 respectively are held resiliently in close contact with the upper surface of the motor case 101 and the lower surface of the inverter case 201 in a liquid-tight manner over the entire circumference, and a sealing space 301 accommodating terminal fittings 102, 202 is kept in a waterproof state. Further, the contact points 59 on both upper and lower contact plates 58 of each of the shielding components 56 are brought into contact with the cases 101, 201. At this time, since the resilient supporting body 57 is deformed resiliently to be curved, both contact plates 58 resiliently and reliably contact the cases 101, 201 due to resilient restoring forces thereof. These shielding components 56 prevent noise superimposed on a current flowing in the terminal fittings 102, 202 from leaking to the outside of the resilient shielding member for the device 50 (sealing space).

A sixth embodiment of the invention is described with reference to FIGS. 10 to 13. A resilient shielding member for device 60 of the sixth embodiment is composed of one waterproofing component 61 and plural shielding function component 65. Note that the same components as in the above first embodiment are denoted by the same reference signs and the structures, functions and effects thereof are not described.

Figure 10:
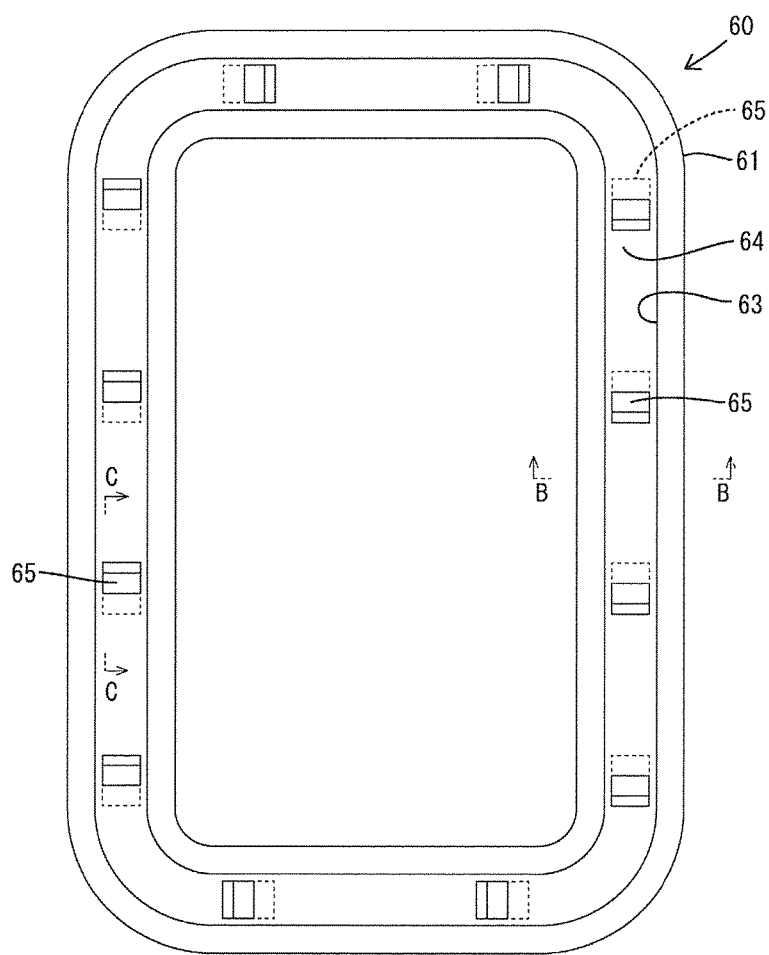
FIG. 10 is a plan view of a resilient shielding member for device of a sixth embodiment.
Figure 11:
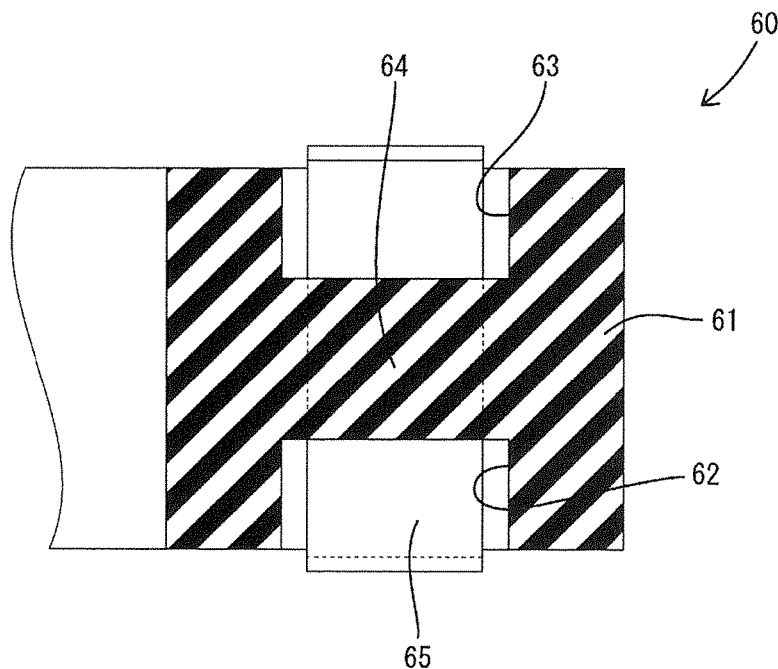
FIG. 11 is a section along B-B of FIG. 10.
Figure 12:
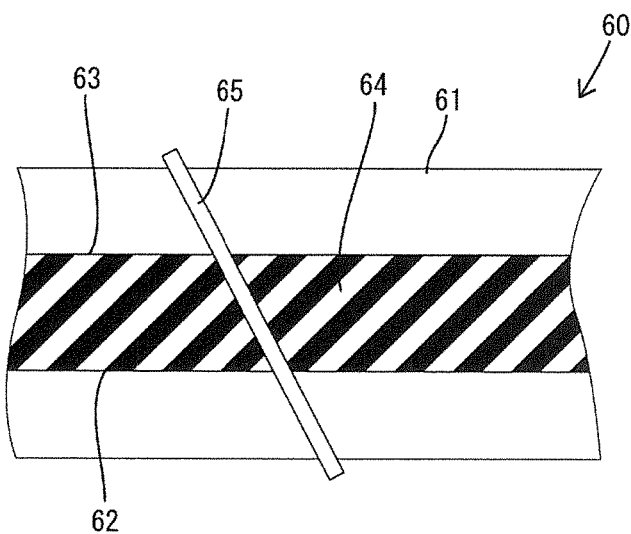
FIG. 12 is a section along C-C of FIG. 10.
Figure 13:
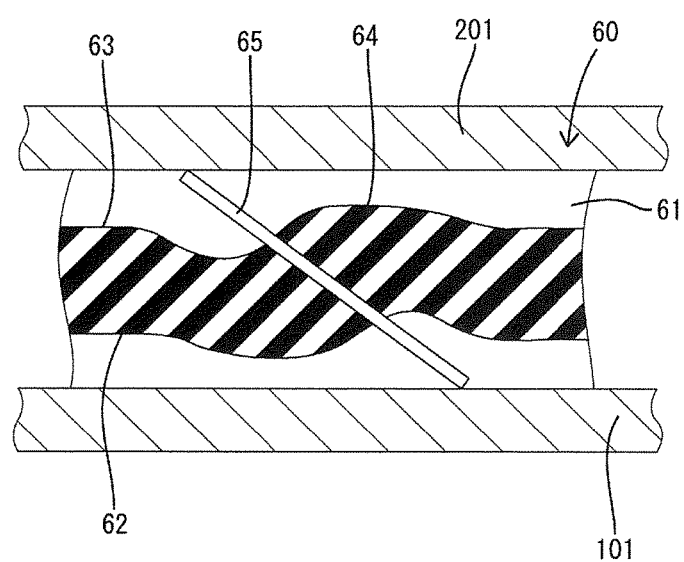
FIG. 13 is a section along C-C showing a state where the resilient shielding member for device is mounted between a motor case and an inverter case in the sixth embodiment.

The waterproofing component 61 is made of rubber and has a substantially rectangular frame shape (ring shape) in a plan view as shown in FIG. 10. As shown in FIGS. 11 to 13, the lower surface (surface facing a motor case) of the waterproofing component 61 is recessed over the entire circumference to form one lower accommodation groove 62. Likewise, the upper surface (surface facing an inverter case) of the waterproofing component 61 is recessed over the entire circumference to form one upper accommodation groove 63. The upper and lower accommodation grooves 63, 62 are defined by a separating wall 64.

The shielding component 65 is formed of a metal plate material substantially in the form of a flat plate. The shielding component 65 is integrated with the waterproofing component 61 by insert molding in such an orientation that plate surfaces thereof are oblique to both a vertical direction (facing direction of the motor case 101 and the inverter case 201) and a horizontal direction. A vertically central part of the shielding component 65 is embedded in the separating wall 64. An upper end part of the shielding component 65 is accommodated in the upper accommodation groove 63 and a lower end part of the shielding component 65 is accommodated in the lower accommodation groove 62.

When an inverter device 200 is connected to a motor 100, the resilient shielding member for device 60 is sandwiched between the upper surface of the motor case 101 and the lower surface of the inverter case 201. In this way, the lower and upper surfaces of the waterproofing component 61 respectively are held resiliently in close contact with the upper surface of the motor case 101 and the lower surface of the inverter case 201 in a liquid-tight manner over the entire circumference, and a sealing space 301 accommodating terminal fittings 102, 202 is kept in a waterproof state.

Further, the upper end edge of each of the plurality of shielding components 65 is brought into contact with the lower surface of the inverter case 201 and the lower end edge thereof is brought into contact with the upper surface of the motor case 101. At this time, since the shielding component 65 is pressed vertically by being sandwiched between the both cases 101, 201 as shown in FIG. 13, an angle of inclination of the shielding component 65 with respect to the horizontal direction becomes smaller. Since the vertically central part of the shielding component 65 is fixed to the separating wall 64, the separating wall 64 is deformed resiliently in a wavy manner as the orientation of the shielding component 65 is inclined (changed).

That is, the shielding component 65 contacts both cases 101, 201 in a state where the orientation of the shielding component 65 is changed to resiliently deform the separating wall 64 of the waterproofing component 61. Thus, both upper and lower end edges of the shielding component 65 resiliently and reliably come into contact with both cases 101, 201 due to a resilient restoring forces of the separating wall 64. These shielding components 65 prevent noise superimposed on a current flowing in the terminal fittings 102, 202 from leaking to the outside of the resilient shielding member for device 60 (sealing space).

A seventh embodiment of the invention is described with reference to FIGS. 14 to 17. A resilient shielding member for device 70 of the seventh embodiment is composed of one waterproofing component 71 and shielding components 75. Note that the same components as in the above first embodiment are denoted by the same reference signs and the structures, functions and effects thereof are not described.

Figure 14:
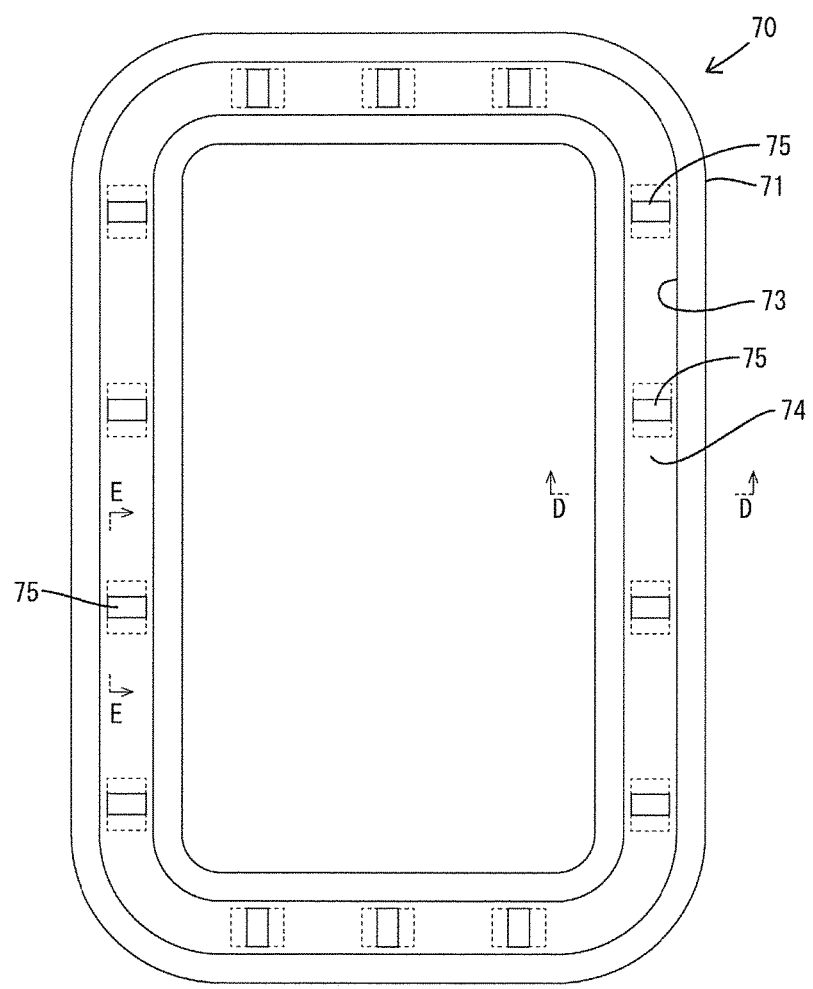
FIG. 14 is a plan view of a resilient shielding member for device of a seventh embodiment.
Figure 15:
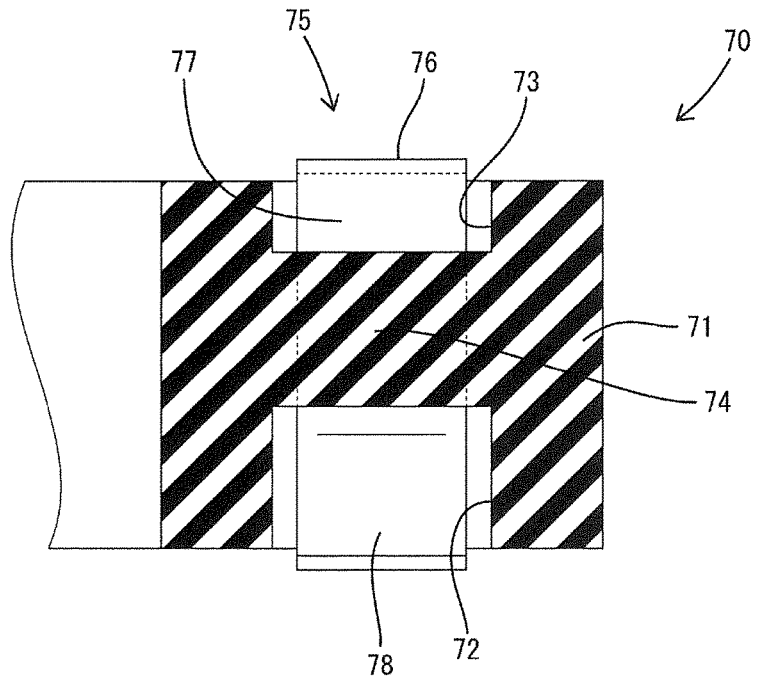
FIG. 15 is a section along D-D of FIG. 14.
Figure 16:
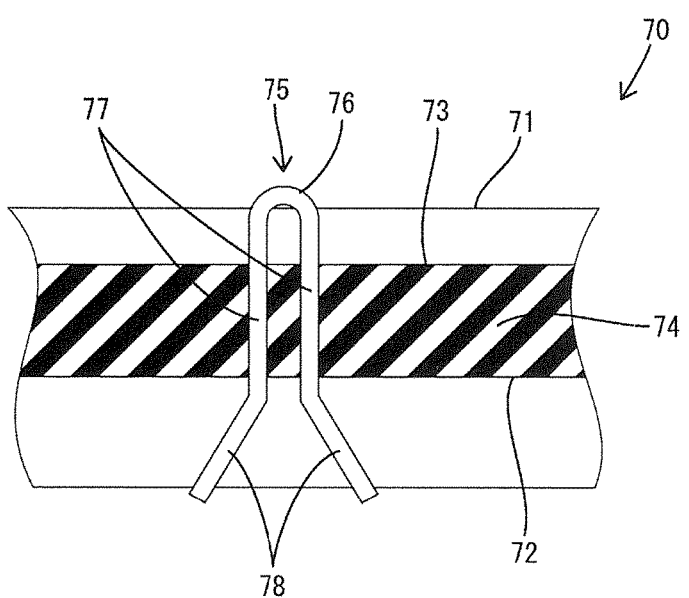
FIG. 16 is a section along E-E of FIG. 14.
Figure 17:
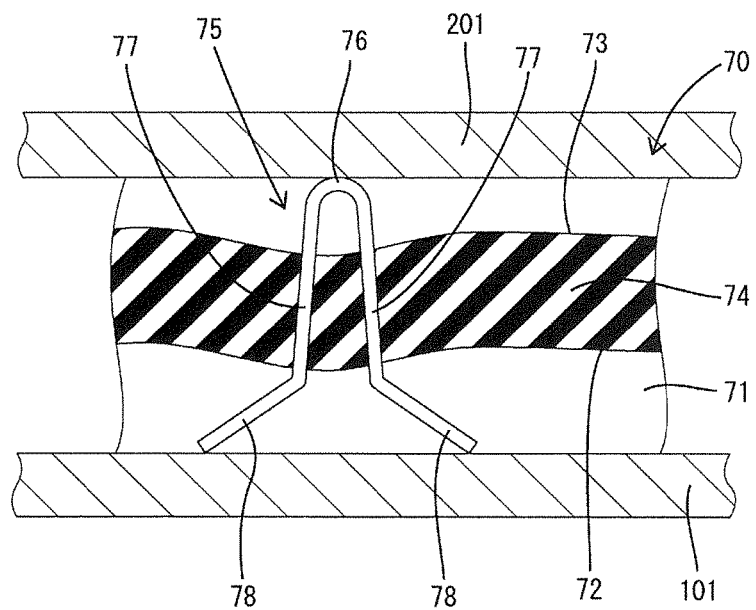
FIG. 17 is a section along E-E showing a state where the resilient shielding member for device is mounted between a motor case and an inverter case in the seventh embodiment.

The waterproofing component 71 is made of rubber and has a substantially rectangular frame shape (ring shape) in a plan view as shown in FIG. 14. As shown in FIGS. 15 to 17, the lower surface (surface facing a motor case) of the waterproofing component 71 is recessed over the entire circumference to form one lower accommodation groove 72. Likewise, the upper surface (surface facing an inverter case) of the waterproofing component 71 is recessed over the entire circumference to form one upper accommodation groove 73. The upper and lower accommodation grooves 73, 72 are defined by a separating wall 74.

The shielding component 75 is a single component formed by bending a metal plate material. The shielding component 75 is composed of a folded portion 76, two legs 77 extending down from the folded portion 76 and two resilient contact pieces 78 obliquely cantilevered down from the lower ends of the legs 77. The resilient contact pieces 78 are oblique to both a vertical direction (facing direction of the motor case 101 and the inverter case 201) and a horizontal direction. The two resilient contact pieces 78 are formed such that a facing distance thereof is increased gradually toward the bottom.

The shielding component 75 is integrated with the waterproofing component 71 by insert molding. Lower end areas of the legs 77 are embedded and fixed in the separating wall 74. Upper end parts of the legs 77 and the folded portion 76 are accommodated in the upper accommodation groove 73 and the resilient contact pieces 78 are accommodated in the lower accommodation groove 72.

When an inverter device 200 is connected to a motor 100, the resilient shielding member for device 70 is sandwiched between the upper surface of the motor case 101 and the lower surface of the inverter case 201. In this way, the lower and upper surfaces of the waterproofing component 71 respectively are held resiliently in close contact with the upper surface of the motor case 101 and the lower surface of the inverter case 201 in a liquid-tight manner over the entire circumference, and a sealing space 301 accommodating terminal fittings 102, 202 is kept in a waterproof state.

Further, the folded portion 76 on the upper end of each of the shielding components 75 is brought into contact with the lower surface of the inverter case 201, and the lower edges of the resilient contact pieces 78 thereof are brought into contact with the upper surface of the motor case 101. At this time, since the shielding component 75 is pressed vertically by being sandwiched between the cases 101, 201, the two legs 77 are widened with the folded portion 76 serving as a support and the two resilient contact pieces 78 are inclined to reduce an angle of inclination with respect to the horizontal direction, as shown in FIG. 17. The lower end areas of the legs 77 are fixed to the separating wall 74. Thus, the separating wall 74 is deformed resiliently in a wavy manner as the shielding component 75 is deformed and inclined.

More particularly, the shielding component 75 is in contact with both cases 101, 201 in a state where the orientation thereof is changed to resiliently deform the separating wall 74 of the shielding component 71. Thus, both upper and lower end edges of the shielding component 75 resiliently and reliably contact both cases 101, 201 due to resilient restoring forces of the separating wall 74. These shielding components 75 prevent noise superimposed on a current flowing in the terminal fittings 102, 202 from leaking to the outside of the resilient shielding member for device 70 (sealing space).

The invention is not limited to the above described and illustrated embodiments. For example, the following embodiments also are included in the scope of the invention.

Although the electrical devices are the inverter device and the motor in the above first to seventh embodiments, the present invention can also be applied when the electrical devices are devices different from the inverter device and the motor.

Although both the first terminal fittings and the second terminal fittings are disposed in the facing space in the above first to seventh embodiments, there is no limitation to this and only either the first terminal fittings or the second terminal fittings may be disposed in the facing space. In this case, the terminal fittings disposed in the facing space enter a mating shield case to be connected to mating terminal fittings.

LIST OF REFERENCE SIGNS

10, 20, 30, 40, 50, 60, 70 . . . resilient shielding member for a device
11, 21, 31, 41, 51, 61, 71 . . . waterproofing component
12 . . . fitting groove (fitting portion)
13, 23, 35, 45, 56, 65, 75 . . . shielding component
16 . . . fitting rib (fitting portion)
37 . . . upper resilient contact piece (resilient contact piece)
38 . . . lower resilient contact piece (resilient contact piece)
78 . . . resilient contact piece
100 . . . motor (first electrical device)
101 . . . motor case (first shield case)
102 . . . first terminal fitting (conductive path)
200 . . . inverter device (second electrical device)
201 . . . inverter case (second shield case)
202 . . . second terminal fitting (conductive path)
300 . . . facing space

The invention claimed is:

1. A resilient shielding member for device, comprising:
   a waterproofing component configured to resiliently contact a conductive first shield case constituting a first electrical device and a second shield case constituting a second electrical device in a liquid-tight manner over the entire circumference; and
   a shielding component configured to conductively contact the first and second shield cases;
   wherein the waterproofing component and the shielding component are integrated and disposed in a facing space between the first and second shield cases and surround conductive paths connecting the first and second electrical devices over an entire circumference.

2. The resilient shielding member for device of claim 1, wherein:
   the waterproofing component and the shielding component are formed separately from each other;
   the waterproofing component and the shielding component are formed with fitting portions configured to hold the waterproofing component and the shielding component in an assembled state by being fit to each other.

3. The resilient shielding member for device of claim 1, wherein the waterproofing component and the shielding component are integrated by insert molding.

4. The resilient shielding member for device of claim 1, wherein the shielding component includes a resilient contact piece configured to contact the first and second shield cases while being resiliently deformed.

5. The resilient shielding member for device of claim 1, wherein the shielding component contacts the first and second shield cases in a state where the orientation thereof is changed to resiliently deform the waterproofing component.

6. The resilient shielding member for device of claim 2, wherein the shielding component includes a resilient contact piece configured to contact the first and second shield cases while being resiliently deformed.

7. The resilient shielding member for device of claim 6, wherein the shielding component contacts the first and second shield cases in a state where the orientation thereof is changed to resiliently deform the waterproofing component.

8. The resilient shielding member for device of claim 1, wherein the shielding component includes a resilient contact piece configured to contact the first and second shield cases while being resiliently deformed.

9. The resilient shielding member for device of claim 8, wherein the shielding component contacts the first and second shield cases in a state where the orientation thereof is changed to resiliently deform the waterproofing component.

10. The resilient shielding member for device of claim 1, wherein the shielding component contacts the first and second shield cases in a state where the orientation thereof is changed to resiliently deform the waterproofing component.

* * * * *